United States Patent
Kang et al.

(10) Patent No.: US 9,745,667 B2
(45) Date of Patent: Aug. 29, 2017

(54) METHOD OF FABRICATING WAFER

(75) Inventors: Seok Min Kang, Seoul (KR); Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 401 days.

(21) Appl. No.: 14/128,855

(22) PCT Filed: Jun. 22, 2012

(86) PCT No.: PCT/KR2012/004963
§ 371 (c)(1),
(2), (4) Date: Dec. 23, 2013

(87) PCT Pub. No.: WO2012/177086
PCT Pub. Date: Dec. 27, 2012

(65) Prior Publication Data
US 2014/0137793 A1    May 22, 2014

(30) Foreign Application Priority Data

Jun. 22, 2011 (KR) ........................ 10-2011-0060906
Jun. 22, 2011 (KR) ........................ 10-2011-0060907
Jun. 22, 2011 (KR) ........................ 10-2011-0060910
Jun. 22, 2011 (KR) ........................ 10-2011-0060912
Jun. 22, 2011 (KR) ........................ 10-2011-0060913

(51) Int. Cl.
*C30B 1/02* (2006.01)
*C30B 25/16* (2006.01)
*H01L 21/02* (2006.01)
*C23C 16/46* (2006.01)
*H01L 21/324* (2006.01)
(Continued)

(52) U.S. Cl.
CPC ............ *C30B 25/16* (2013.01); *C23C 16/463* (2013.01); *C30B 33/00* (2013.01); *C30B 33/02* (2013.01); *H01L 21/0262* (2013.01); *H01L 21/02378* (2013.01); *H01L 21/02433* (2013.01);
(Continued)

(58) Field of Classification Search
CPC .................................... C30B 1/02; C30B 1/10
See application file for complete search history.

(56) References Cited

U.S. PATENT DOCUMENTS 6,307,241 B1 * 10/2001 Awschalom ........... B82Y 25/00
                                                         257/421
8,202,788 B2 *  6/2012 Yoon ....................... C30B 29/40
                                                          117/103
(Continued)

FOREIGN PATENT DOCUMENTS

JP    2008-115035 A    5/2008
KR    10-0193052 B1    7/1999
(Continued)

OTHER PUBLICATIONS

International Search Report in International Application No. PCT/KR2012/004963, dated Apr. 2, 2013.

*Primary Examiner* — Robert M Kunemund
(74) *Attorney, Agent, or Firm* — Saliwanchik, Lloyd & Eisenschenk

(57) ABSTRACT

A method of fabricating a wafer according to the embodiment comprises the steps of growing an wafer on a surface of the wafer in a growth temperature; and cooling the wafer after the wafer has been grown, wherein a stepwise cooling is performed when cooling the wafer.

18 Claims, 3 Drawing Sheets

(51) Int. Cl.
  *C30B 33/00*   (2006.01)
  *C30B 33/02*   (2006.01)
(52) U.S. Cl.
  CPC .. *H01L 21/02532* (2013.01); *H01L 21/02664* (2013.01); *H01L 21/324* (2013.01)

(56) References Cited

U.S. PATENT DOCUMENTS

2003/0051656 A1* 3/2003 Yang ................... H01L 21/3225
                                                                                                   117/3
2010/0148415 A1* 6/2010 Nakamura ........ H01L 21/67098
                                                                                                   269/289 R

FOREIGN PATENT DOCUMENTS

KR   10-2002-0010708 A    4/2002
KR       10-0845946 B1    7/2008

* cited by examiner

METHOD OF FABRICATING WAFER

CROSS-REFERENCE TO RELATED APPLICATIONS

This application is the U.S. national stage application of International Patent Application No. PCT/KR2012/004963, filed Jun. 22, 2012, which claims priority to Korean Applications Nos. 10-2011-0060906, filed Jun. 22, 2011, 10-2011-0060907, filed Jun. 22, 2011, 10-2011-0060910, filed Jun. 22, 2011, 10-2011-0060912, filed Jun. 22, 2011, and 10-0060913, filed Jun. 22, 2011, the disclosures of each of which are incorporated herein by reference in their entirety.

TECHNICAL FIELD

The disclosure relates to a method of fabricating a wafer.

BACKGROUND ART

The most important subject in studies for improving the efficiency and characteristic of semiconductor devices is to reduce the crystal defect of a semiconductor layer grown on a substrate and to improve crystallinity of the semiconductor layer.

Various types of defects may be formed when fabricating an epitaxial wafer (hereinafter, these defects will be referred to as epitaxial defects). For instance, there may be presented various defects, such as a defect created in a basal plane of a lattice, a defect caused by the tilting of the lattice, and a defect created on a surface of the wafer. These defects may exert bad influence upon the semiconductor device employing the wafer. In addition, when the semiconductor device is fabricated by using the wafer, great leakage current may be generated due to the non-uniformity of metal electrode deposition and patterns.

A buffer layer is formed in order to reduce the dislocation defect during the crystal growth process. Thus, a mask forming process, a process for forming a pattern on a substrate through etching, and a regrowing process are additionally necessary to form the buffer layer.

Due to the above additional processes, the fabrication process is complicated, the fabrication cost is increased, and the quality of a substrate surface is deteriorated.

DISCLOSURE OF INVENTION

Technical Problem

The embodiment provides a wafer having high quality.

Solution to Problem

A method of fabricating a wafer according to the embodiment comprises the steps of growing an wafer on a surface of the wafer in a growth temperature; and cooling the wafer after the wafer has been grown, wherein a stepwise cooling is performed when cooling the wafer.

Advantageous Effects of Invention

The method of fabricating the wafer according to the embodiment comprises the stepwise cooling. Through the stepwise cooling, the strain caused by thermal stress generated when the wafer is grown can be attenuated. Thus, the defects can be prevented and the performance of the wafer can be improved by controlling the defects. In addition, the embodiment can provide the wafer having high quality by controlling the warping and twisting of the epitaxial wafer.

According to the embodiment, a buffer layer can be removed without the defect, so the process can be simplified. In addition, an additional process to form the buffer layer can be omitted so that the fabrication cost can be reduced and the quality of the substrate surface can be improved.

The method of fabricating the wafer according to another embodiment comprises the annealing step. By performing the annealing step, the mismatch between the wafer and the wafer caused by the thermal expansion can be suppressed.

MODE FOR THE INVENTION

Figure 1:
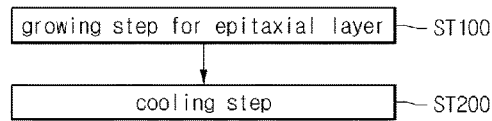
FIG. 1 is a flowchart showing a method of fabricating a wafer according to the first embodiment.

In the description of the embodiments, it will be understood that, when a layer (film), a region, a pattern or a structure is referred to as being "on" or "under" another layer (film), another region, another pattern or another structure, it can be "directly" or "indirectly" on the other layer (film), region, pattern, or structure, or one or more intervening layers may also be present. Such a position of the layer has been described with reference to the drawings.

The thickness and size of each layer (film), each region, each pattern or each structure shown in the drawings may be modified for the purpose of convenience or clarity, so the size of elements does not utterly reflect an actual size.

Hereinafter, exemplary embodiments will be described in detail with reference to accompanying drawings.

A method of fabricating a wafer according to the first embodiment will be described in detail with reference to accompanying drawings. FIG. 1 is a flowchart showing the method of fabricating the wafer according to the first embodiment and FIG. 2 is a graph for explaining the method of fabricating the wafer according to the first embodiment.

Figure 2:
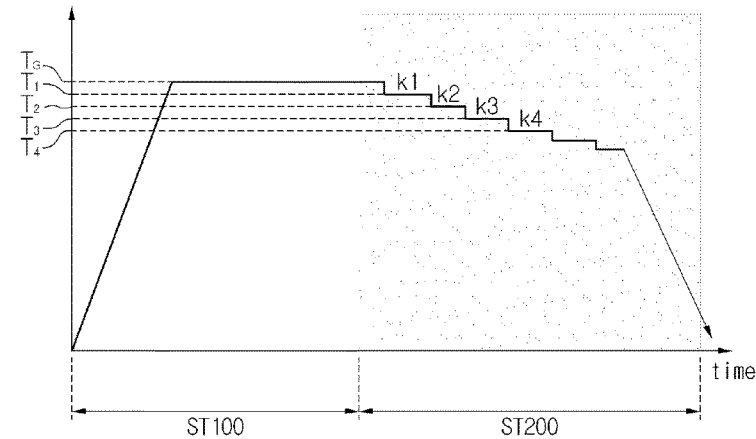
FIG. 2 is a graph for explaining a method of fabricating a wafer according to the first embodiment.

Referring to FIGS. 1 and 2, the method of fabricating the wafer according to the first embodiment comprises a growing step ST100 for an wafer and a cooling step ST200.

In growing step ST100 for the wafer, the wafer may be grown on the surface of the wafer. The wafer can be formed by growing a single crystal layer including a material equal to or different from a material for the wafer on the surface of a single crystal wafer.

In general, the wafer can be formed through a chemical vapor deposition (CVD) process. Especially, the CVD process may comprise thermal CVD, plasma enhanced CVD, low-pressure CVD, metal organic CVD, and atomic layer deposition processes. These processes may be properly selected according to the characteristic of the target layer to be formed.

In the case of the CVD process, reaction gas, such as source gas, carrier gas or pressure adjusting gas, is supplied onto the wafer placed in a vacuum chamber and the wafer is formed on the wafer through the surface reaction between the reaction gas and the wafer. For instance, the wafer can be formed by depositing silane ($SiH_4$) or DSC (dichlorosilane, $SiH_2$) on the wafer surface in CVD equipment using $H_2$ and Ar gas as carriers.

In growing step ST100 for the wafer, the wafer can be grown under the predetermined growth temperature $T_G$. For instance, the growth temperature $T_G$ is in the range of 1300° C. to 1700° C.

According to the related art, the epitaxial wafer is cooled just after the wafer has been grown.

However, when the epitaxial wafer is cooled, the cooling rate in the wafer may not be uniform. That is, the cooling rate at the center of the wafer may be lower than the cooling rate at the outer peripheral portion of the wafer. Thus, the temperature may be slowly dropped at the center of the wafer relative to the outer peripheral portion of the wafer. In this case, the temperature gradient may occur in the wafer. That is, the defect may occur in the wafer due to the temperature gradient.

In general, many defects derived from the wafer are generated in the wafer. Such defects may lower the product yield of the semiconductor devices, so these defects must be always controlled by regarding these defects as management factors.

Various types of defects may be formed when fabricating an epitaxial wafer (hereinafter, these defects will be referred to as epitaxial defects). For instance, there may be presented various defects, such as a defect created in a basal plane of a lattice, a defect caused by the tilting of the lattice, and a defect created on a surface of the wafer. These defects may exert bad influence upon the semiconductor device employing the wafer. In addition, when the semiconductor device is fabricated by using the wafer, great leakage current may be generated due to the non-uniformity of metal electrode deposition and patterns.

The representative epitaxial defects to be seriously managed are stacking fault and dislocation. These epitaxial defects are derived from a defect in the sub-wafer or particles and formed during the wafer growth process. In addition, since these epitaxial defects are formed on the surface of the wafer with a large size, these epitaxial defects may be readily observed by a particle counter or a naked eye.

In particular, the wafer including silicon carbide may have the basal plane dislocation (BPD). The BPD may be caused due to the temperature gradient existing in the wafer or the mismatch caused by thermal expansion. In addition, the BPD may be generated due to the plastic deformation or thermal stress. Since the BPD exerts great influence upon the reliability of the semiconductor device, it is very important to reduce the BPD.

The BPD is frequently observed from a 4 off-axis 4H—SiC wafer or a 8 off-axis 4H—SiC wafer. Among the commercial wafers used in these days, a 4H—SiC wafer is cut in the specific direction at an angle of 4 or 8. In addition, the 4 off-axis 4H—SiC wafer and the 8 off-axis 4H—SiC wafer refer to the wafers which are cut at an angle of 4 and 8, respectively.

According to the present embodiment, the stepwise cooling is performed after the wafer has been formed in order to suppress the defects. Hereinafter, the stepwise cooling will be described in detail.

In cooling step ST200, the epitaxial wafer is cooled. In detail, the stepwise cooling is performed from the growth temperature $T_G$ in cooling step ST200.

In more detail, cooling step ST200 may comprise the steps of cooling the wafer until a first temperature $T_1$ reaches, maintaining the wafer in the first temperature $T_1$ (K1), cooling the wafer until a second temperature $T_2$ lower than the first temperature $T_1$ reaches, maintaining the wafer in the second temperature $T_2$ (K2), cooling the wafer until a third temperature $T_3$ lower than the second temperature $T_2$ reaches, and maintaining the wafer in the third temperature $T_3$ (K3).

Cooling step ST200 may further comprise the steps of cooling the wafer until a fourth temperature $T_4$ lower than the third temperature $T_3$ reaches, and maintaining the wafer in the fourth temperature $T_4$ (K4).

Although the drawing shows the steps to the extent of cooling the wafer until the fourth temperature $T_4$ reaches, and maintaining the wafer in the fourth temperature $T_4$ (K4), the embodiment is not limited thereto. That is, the stepwise cooling may be further performed after the steps of cooling the wafer until the fourth temperature $T_4$ reaches, and maintaining the wafer in the fourth temperature $T_4$ (K4).

In other words, cooling step ST200 may be performed while gradually lowering the temperature.

The stepwise cooling may be performed at the rate of 0.1° C./hour to 10° C./hour.

The strain caused by the thermal stress generated in growing step ST100 for the wafer can be attenuated through the stepwise cooling. Thus, the defects can be prevented and the performance of the wafer can be improved by controlling the defects. In addition, the wafer having high quality can be provided by controlling the warping and twisting of the epitaxial wafer.

According to the related art, the buffer layer is formed on the wafer and the wafer is formed on the buffer layer to suppress the BPD. That is, the buffer layer is provided to prevent the crystal defect caused by the mismatch in lattice constant and thermal expansion coefficient between the wafer and the wafer. However, an additional patterning process, such as an etching, and a regrowing process must be further performed to form the buffer layer.

According to the present embodiment, the defects can be removed without the buffer layer, so the process can be simplified. In addition, the additional process to form the buffer layer can be omitted, so that the fabrication cost can be reduced and the quality of the substrate surface can be improved.

Hereinafter, a method of fabricating a wafer according to the second embodiment will be described in detail with reference to FIGS. 3 and 4. For the purpose of clarity and simplicity, the description about the elements and structures the same as or similar to those of the first embodiment will be omitted.

Figure 3:
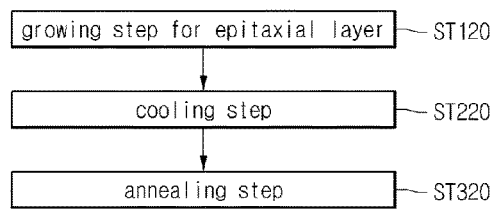
FIG. 3 is a flowchart showing a method of fabricating a wafer according to the second embodiment.
Figure 4:
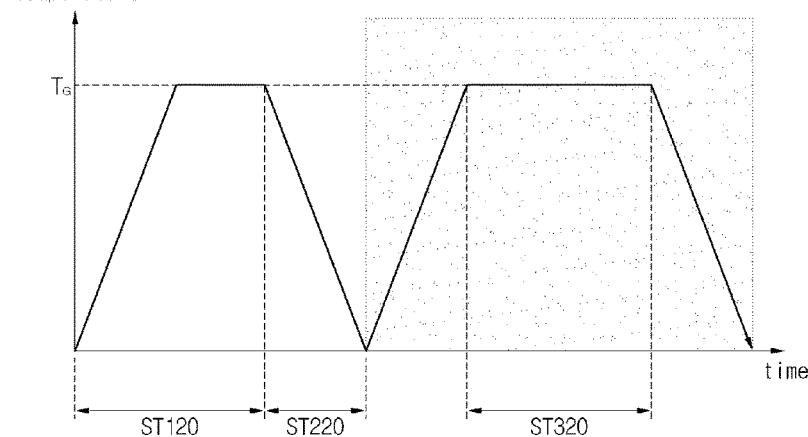
FIG. 4 is a graph for explaining a method of fabricating a wafer according to the second embodiment.

FIG. 3 is a flowchart showing the method of fabricating the wafer according to the second embodiment, and FIG. 4 is a graph for explaining the method of fabricating the wafer according to the second embodiment.

Referring to FIGS. 3 and 4, the method of fabricating the wafer according to the second embodiment comprises a growing step ST120 for an wafer, a cooling step ST220 and an annealing step ST320.

In growing step ST120 for the wafer, the wafer may be grown on the surface of the wafer.

In growing step ST120 for the wafer, the wafer can be grown in a first chamber under the predetermined growth temperature $T_G$. For instance, the growth temperature $T_G$ is in the range of 1300° C. to 1700° C.

After the wafer has been grown, the wafer is subject to cooling step ST220. In cooling step ST220, the growth temperature $T_G$ is lowered to stabilize the wafer on the wafer.

However, in cooling step ST220, the cooling rate in the wafer may not be uniform. That is, the cooling rate at the center of the wafer may be lower than the cooling rate at the outer peripheral portion of the wafer. Thus, the temperature may be slowly dropped at the center of the wafer relative to the outer peripheral portion of the wafer. In this case, the temperature gradient may occur in the wafer. That is, the defect may occur in the wafer due to the temperature gradient.

The BPD may frequently occur in cooling step ST220.

Then, the epitaxial wafer is annealed in annealing step ST320. That is, the epitaxial wafer is heat-treated at a predetermined temperature.

Annealing step ST320 can be performed at the temperature corresponding to or lower than the growth temperature $T_G$. For instance, annealing step ST320 can be performed at the temperature in the range of 800° C. to 1800° C. In addition, annealing step ST320 can be performed for 1 hour or more.

However, the embodiment is not limited to the above. For instance, annealing step ST320 can be performed at the temperature higher than the growth temperature $T_G$. In this case, annealing step ST320 can be performed for about 1 hour.

Annealing step ST320 can be performed under the high vacuum condition.

Annealing step ST320 can be performed in a second chamber different from the first chamber. The second chamber may have a size larger than that of the first chamber. Thus, a plurality of epitaxial wafers can be loaded in the second chamber. Therefore, the process time can be reduced and the process efficiency can be improved.

The mismatch between the wafer and the wafer caused by the thermal expansion can be suppressed through annealing step ST320.

Figure 5:
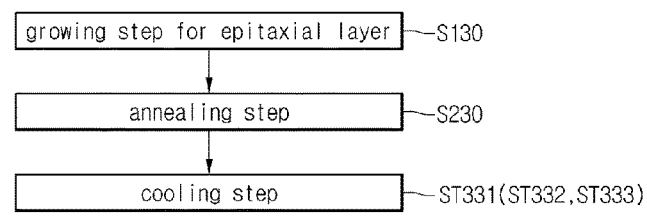
FIG. 5 is a flowchart showing a method of fabricating a wafer according to the third embodiment.

Hereinafter, a method of fabricating a wafer according to the third embodiment will be described in detail with reference to FIGS. 5 and 6. FIG. 5 is a flowchart showing the method of fabricating the wafer according to the third embodiment, and FIG. 6 is a graph for explaining the method of fabricating the wafer according to the third embodiment.

Figure 6:
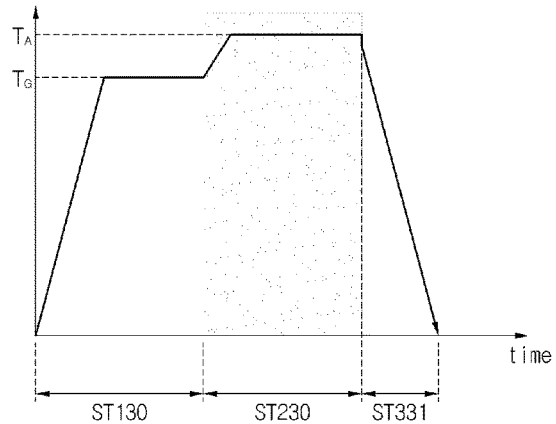
FIG. 6 is a graph for explaining a method of fabricating a wafer according to the third embodiment.

Referring to FIGS. 5 and 6, the method of fabricating the wafer according to the third embodiment comprises a growing step ST130 for an wafer, an annealing step ST230 and a cooling step ST331.

In growing step ST130 for the wafer, the wafer may be grown on the surface of the wafer.

Then, the epitaxial wafer is annealed in annealing step ST230. That is, the epitaxial wafer is heat-treated at a predetermined temperature.

Annealing step ST230 can be performed at the temperature $T_A$ higher than the growth temperature $T_G$. In detail, the annealing temperature $T_A$ may be higher than the growth temperature $T_G$ by 100° C. to 200° C. In addition, annealing step ST230 can be performed for about 1 hour.

Annealing step ST230 can be performed under the high vacuum condition.

Annealing step ST230 can be performed in a chamber where growing step ST130 for the wafer is performed. That is, annealing step ST230 can be performed in-situ so the process time can be reduced.

The mismatch between the wafer and the wafer caused by the thermal expansion can be suppressed through annealing step ST230.

According to the present embodiment, the wafer is not cooled just after the wafer has been grown, but cooled after performing annealing step ST230, so the defects can be suppressed.

In cooling step ST331, the epitaxial wafer is cooled. In cooling step ST331, the annealing temperature $T_A$ is lowered to stabilize the wafer on the wafer.

Hereinafter, a method of fabricating a wafer according to the fourth embodiment will be described in detail with reference to FIG. 7.

Figure 7:
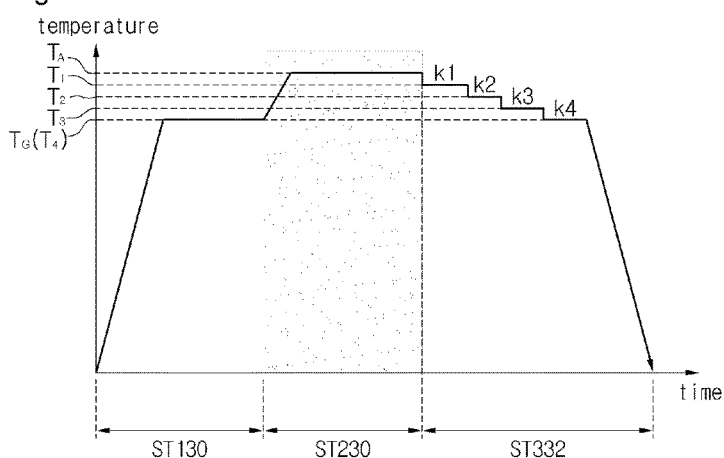
FIG. 7 is a graph for explaining a method of fabricating a wafer according to the fourth embodiment.

FIG. 7 is a graph for explaining the method of fabricating the wafer according to the fourth embodiment.

The method of fabricating the wafer according to the fourth embodiment comprises a cooling step ST332 after an annealing step ST230 and the stepwise cooling is performed in cooling step ST332. In detail, the stepwise cooling is performed until the growth temperature $T_G$ reaches in cooling step ST332.

In more detail, cooling step ST331 may comprise the steps of cooling the wafer until a first temperature $T_1$ reaches, maintaining the wafer in the first temperature $T_1$ (K1), cooling the wafer until a second temperature $T_2$ lower than the first temperature $T_1$ reaches, maintaining the wafer in the second temperature $T_2$ (K2), cooling the wafer until a third temperature $T_3$ lower than the second temperature $T_2$ reaches, maintaining the wafer in the third temperature $T_3$ (K3), cooling the wafer until a fourth temperature $T_4$ lower than the third temperature $T_3$ reaches, and maintaining the wafer in the fourth temperature $T_4$ (K4).

The fourth temperature $T_4$ may correspond to the growth temperature $T_G$.

Although the drawing shows the steps to the extent of cooling the wafer until the fourth temperature $T_4$ reaches, and maintaining the wafer in the fourth temperature $T_4$ (K4), the embodiment is not limited thereto. That is, the stepwise cooling may be further performed until the growth temperature $T_G$ reaches.

The stepwise cooling may be performed at the rate of 0.1° C./hour to 10° C./hour.

The strain caused by the thermal stress generated in step growing ST130 for the wafer can be attenuated through the stepwise cooling. Thus, the defects can be prevented and the performance of the wafer can be improved by controlling the defects. In addition, the wafer having high quality can be provided by controlling the warping and twisting of the epitaxial wafer.

According to the related art, the buffer layer is formed on the wafer and the wafer is formed on the buffer layer to suppress the BPD. That is, the buffer layer is provided to prevent the crystal defect caused by the mismatch in lattice constant and thermal expansion coefficient between the wafer and the wafer. However, an additional patterning process, such as an etching, and a regrowing process must be further performed to form the buffer layer.

According to the present embodiment, the defects can be removed without the buffer layer, so the process can be simplified. In addition, the additional process to form the buffer layer can be omitted, so that the fabrication cost can be reduced and the quality of the substrate surface can be improved.

Figure 8:
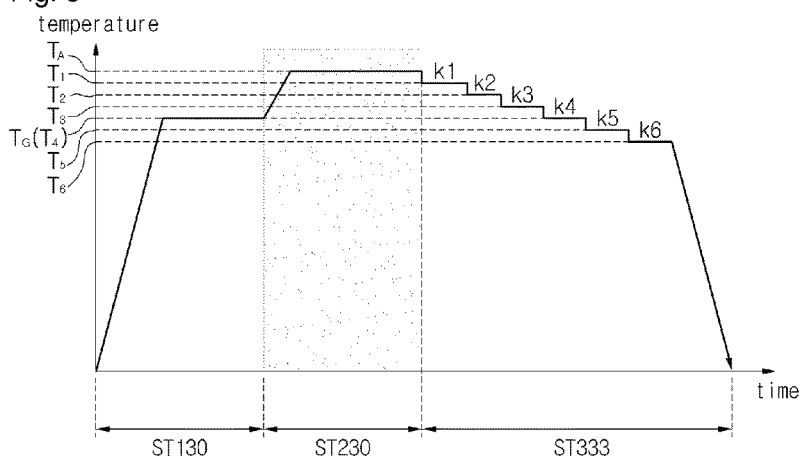
FIG. 8 is a graph for explaining a method of fabricating a wafer according to the fifth embodiment.

Hereinafter, a method of fabricating a wafer according to the fifth embodiment will be described in detail with reference to FIG. 8. FIG. 8 is a graph for explaining the method of fabricating the wafer according to the fifth embodiment.

The method of fabricating the wafer according to the fifth embodiment comprises a cooling step ST333 after an annealing step ST230 and the stepwise cooling is performed in cooling step ST332. In detail, the stepwise cooling is performed until the temperature becomes equal to or lower than the growth temperature $T_G$ in cooling step ST333.

In more detail, cooling step ST333 may comprise the steps of cooling the wafer until a first temperature $T_1$ reaches, maintaining the wafer in the first temperature $T_1$ (K1), cooling the wafer until a second temperature $T_2$ lower than the first temperature $T_1$ reaches, maintaining the wafer in the second temperature $T_2$ (K2), cooling the wafer until a third temperature $T_3$ lower than the second temperature $T_2$ reaches, maintaining the wafer in the third temperature $T_3$ (K3), cooling the wafer until a fourth temperature $T_4$ lower than the third temperature $T_3$ reaches, and maintaining the wafer in the fourth temperature $T_4$ (K4). At this time, the fourth temperature $T_4$ may correspond to the growth temperature $T_G$.

Meanwhile, cooling step ST33 may further comprise the steps of cooling the wafer until a fifth temperature $T_5$ lower than the growth temperature $T_G$ reaches, maintaining the wafer in the fifth temperature $T_5$, cooling the wafer until a sixth temperature $T_6$ lower than the fifth temperature $T_5$ reaches, and maintaining the wafer in the sixth temperature $T_6$.

Although the drawing shows the steps to the extent of cooling the wafer until the sixth temperature $T_6$ reaches, and maintaining the wafer in the sixth temperature $T_6$, the embodiment is not limited thereto. That is, the stepwise cooling may be further performed after the steps of cooling the wafer until the sixth temperature $T_6$ reaches, and maintaining the wafer in the sixth temperature $T_6$.

Figure 9:
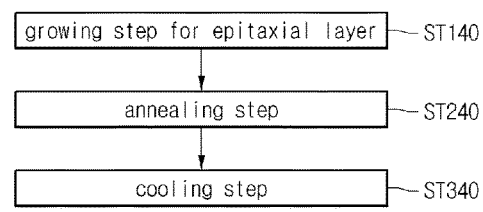
FIG. 9 is a flowchart showing a method of fabricating a wafer according to the sixth embodiment.

Hereinafter, a method of fabricating a wafer according to the sixth embodiment will be described in detail with reference to FIGS. 9 and 10. FIG. 9 is a flowchart showing the method of fabricating the wafer according to the sixth embodiment and FIG. 10 is a graph for explaining the method of fabricating the wafer according to the sixth embodiment.

Figure 10:
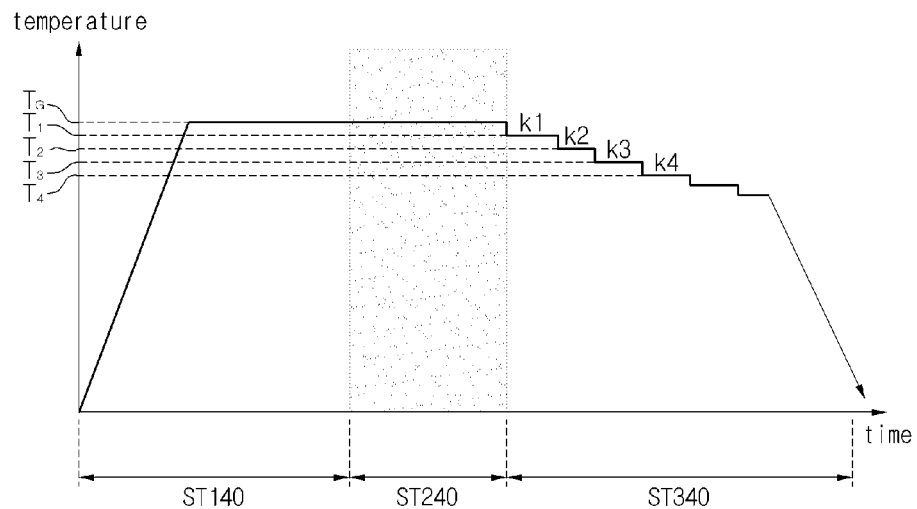
FIG. 10 is a graph for explaining a method of fabricating a wafer according to the sixth embodiment.

Referring to FIGS. 9 and 10, the method of fabricating the wafer according to the sixth embodiment comprises a growing step ST140 for an wafer, an annealing step ST200 and a cooling step ST340.

In growing step ST140 for the wafer, the wafer may be grown on the surface of the wafer.

Then, the epitaxial wafer is annealed in annealing step ST240. That is, the epitaxial wafer is heat-treated at a predetermined temperature.

Annealing step ST240 can be performed at the temperature corresponding to or lower than the growth temperature $T_G$. For instance, annealing step ST240 can be performed at the temperature in the range of 800° C. to 1800° C. In addition, annealing step ST240 can be performed for 1 hour or more.

However, the embodiment is not limited to the above. For instance, annealing step ST240 can be performed at the temperature higher than the growth temperature $T_G$. In this case, annealing step ST240 can be performed for about 1 hour.

The mismatch between the wafer and the wafer caused by the thermal expansion can be suppressed through annealing step ST240.

In cooling step ST340, the epitaxial wafer is cooled. In detail, the stepwise cooling is performed in cooling step ST340.

In more detail, cooling step ST340 may comprise the steps of cooling the wafer until a first temperature $T_1$ reaches, maintaining the wafer in the first temperature $T_1$ (K1), cooling the wafer until a second temperature $T_2$ lower than the first temperature $T_1$ reaches, maintaining the wafer in the second temperature $T_2$ (K2), cooling the wafer until a third temperature $T_3$ lower than the second temperature $T_2$ reaches, and maintaining the wafer in the third temperature $T_3$ (K3).

Cooling step ST340 may further comprise the steps of cooling the wafer until a fourth temperature $T_4$ lower than the third temperature $T_3$ reaches, and maintaining the wafer in the fourth temperature $T_4$ (K4).

Figure 11:
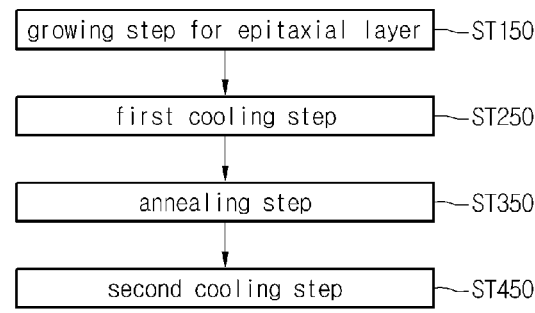
FIG. 11 is a flowchart showing a method of fabricating a wafer according to the seventh embodiment.

Hereinafter, a method of fabricating a wafer according to the seventh embodiment will be described in detail with reference to FIGS. 11 and 12. FIG. 11 is a flowchart showing the method of fabricating the wafer according to the seventh embodiment and FIG. 12 is a graph for explaining the method of fabricating the wafer according to the seventh embodiment.

Figure 12:
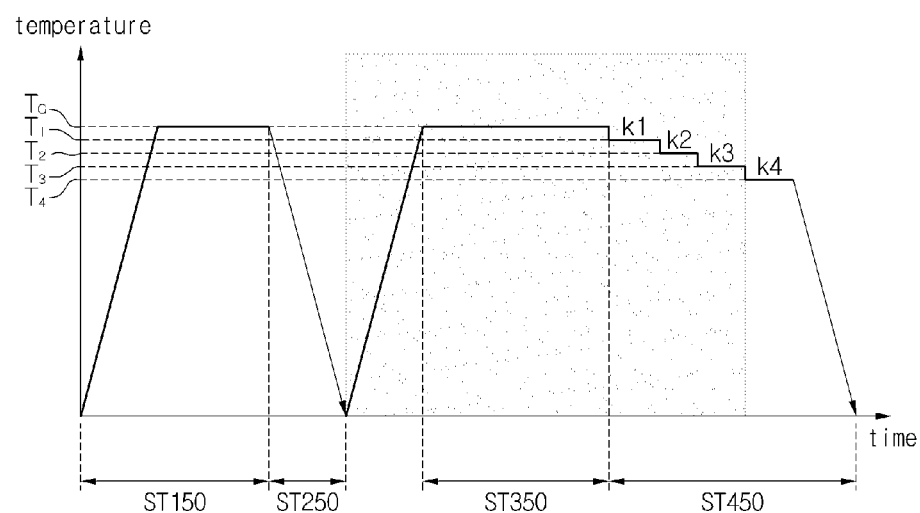
FIG. 12 is a graph for explaining a method of fabricating a wafer according to the seventh embodiment.

Referring to FIGS. 11 and 12, the method of fabricating the wafer according to the seventh embodiment comprises a growing step ST150 for an wafer, a first cooling step ST250, an annealing step ST350 and a second cooling step ST450.

In growing step ST150 for the wafer, the wafer may be grown on the surface of the wafer.

In growing step ST150 for the wafer, the wafer can be grown in a first chamber under the predetermined growth temperature $T_G$.

After the wafer has been grown, the wafer is subject to first cooling step ST250. In first cooling step ST250, the growth temperature $T_G$ is lowered to stabilize the wafer on the wafer.

Then, the epitaxial wafer is annealed in annealing step ST350. That is, the epitaxial wafer is heat-treated at a predetermined temperature.

Annealing step ST350 can be performed at the temperature corresponding to or lower than the growth temperature $T_G$. For instance, annealing step ST350 can be performed at the temperature in the range of 800° C. to 1800° C.

However, the embodiment is not limited to the above. For instance, annealing step ST350 can be performed at the temperature higher than the growth temperature $T_G$. In this case, annealing step ST350 can be performed for about 1 hour.

Annealing step ST350 can be performed in a second chamber different from the first chamber. The second chamber may have a size larger than that of the first chamber. Thus, a plurality of epitaxial wafers can be loaded in the second chamber. Therefore, the process time can be reduced and the process efficiency can be improved.

The mismatch between the wafer and the wafer caused by the thermal expansion can be suppressed through annealing step ST350.

Then, the epitaxial wafer is cooled in second cooling step ST450. In detail, the stepwise cooling is performed in second cooling step ST450.

In more detail, second cooling step ST450 may comprise the steps of cooling the wafer until a first temperature $T_1$ reaches, maintaining the wafer in the first temperature $T_1$ (K1), cooling the wafer until a second temperature $T_2$ lower than the first temperature $T_1$ reaches, maintaining the wafer in the second temperature $T_2$ (K2), cooling the wafer until a third temperature $T_3$ lower than the second temperature $T_2$ reaches, and maintaining the wafer in the third temperature $T_3$ (K3).

Second cooling step ST450 may further comprise the steps of cooling the wafer until a fourth temperature $T_4$ lower than the third temperature $T_3$ reaches, and maintaining the wafer in the fourth temperature $T_4$ (K4).

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of fabricating a wafer, the method comprising:
   growing a single crystal layer on a surface of the wafer at a growth temperature;
   cooling the wafer after the single crystal layer has been grown; and
   annealing the wafer,
   wherein the annealing of the wafer is performed at a temperature corresponding to or lower than the growth temperature,
   wherein the growing of the single crystal layer and the annealing of the wafer are performed in the same chamber in situ, and
   wherein the wafer is cut at an angle of 4° or 8°.

2. The method of claim 1, wherein the annealing of the wafer is performed at a temperature of 800° C. to 1800° C.

3. The method of claim 1, wherein the annealing of the wafer is performed for 1 hour or more.

4. The method of claim 1, wherein the cooling of the wafer comprises:
   a first cooling of the wafer after the wafer has been grown; and
   a second cooling of the wafer after the wafer has been annealed.

5. The method of claim 4, wherein a stepwise cooling is performed in the second cooling of the wafer.

6. A method of fabricating a wafer, the method comprising:
   growing a single crystal layer on a surface of the wafer at a growth temperature;
   annealing the wafer after the single crystal layer has been grown; and
   cooling the wafer after the wafer has been annealed,
   wherein the annealing of the wafer is performed at a temperature higher than the growth temperature,
   wherein the growing of the single crystal layer and the annealing of the wafer are performed in the same chamber in situ, and
   wherein the wafer is cut at an angle of 4° or 8°.

7. The method of claim 6, wherein the annealing of the wafer is performed at a temperature higher than the growth temperature by 100° C. to 200° C.

8. The method of claim 6, wherein the cooling of the wafer comprises cooling the wafer until a first temperature is reached, maintaining the wafer at the first temperature, cooling the wafer until a second temperature lower than the first temperature is reached, maintaining the wafer at the second temperature, cooling the wafer until a third temperature lower than the second temperature is reached, maintaining the wafer at the third temperature, cooling the wafer until a fourth temperature lower than the third temperature is reached, and maintaining the wafer at the fourth temperature.

9. The method of claim 8, wherein the fourth temperature corresponds to the growth temperature.

10. The method of claim 6, wherein a stepwise cooling is performed in the cooling of the wafer until a temperature becomes equal to or lower than the growth temperature.

11. The method of claim 8, wherein the cooling of the wafer further comprises cooling the wafer until a fifth temperature lower than the fourth temperature is reached, maintaining the wafer at the fifth temperature, cooling the wafer until a sixth temperature lower than the fifth temperature is reached, and maintaining the wafer at the sixth temperature.

12. The method of claim 6, wherein the annealing of the wafer is performed at a temperature of 800° C. to 1800° C.

13. The method of claim 1, wherein the wafer includes silicon carbide.

14. The method of claim 1, wherein the annealing is performed under a vacuum condition.

15. The method of claim 11, wherein the stepwise cooling is performed at a rate of 0.1° C./hour to 10° C./hour.

16. The method of claim 6, wherein the wafer includes silicon carbide.

17. The method of claim 6, wherein the annealing is performed under a vacuum condition.

18. The method of claim 10, wherein the stepwise cooling is performed at a rate of 0.1° C./hour to 10° C./hour.

* * * * *